(12) United States Patent
Feng

(10) Patent No.: US 6,664,858 B2
(45) Date of Patent: Dec. 16, 2003

(54) ADJUSTABLE PEAKING CAPACITOR IN HIGH-SPEED OPTICAL FIBER COMMUNICATION RECEIVER

(75) Inventor: Kai D. Feng, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 47 days.

(21) Appl. No.: 09/915,113

(22) Filed: Jul. 25, 2001

(65) Prior Publication Data

US 2003/0020547 A1 Jan. 30, 2003

(51) Int. Cl.[7] ................................................. H03F 3/08
(52) U.S. Cl. .................... 330/308; 330/110; 330/86; 25/214.1; 25/214 AG; 25/214 AL
(58) Field of Search ............................... 330/110, 308, 330/86; 250/214 A, 214.1, 214 AG, 214 AL

(56) References Cited

U.S. PATENT DOCUMENTS 4,868,516 A * 9/1989 Henderson ................... 330/86
5,146,079 A   9/1992 Lisco ..................... 250/214 AG
5,257,285 A  10/1993 Thorp ......................... 330/293
5,373,152 A  12/1994 Domon et al. .......... 250/214 AG
5,602,511 A   2/1997 Woolaway .................. 330/282
5,786,730 A   7/1998 Hadley ......................... 330/59
5,933,264 A   8/1999 VanDer Heijden ....... 250/214 A

FOREIGN PATENT DOCUMENTS

JP          403097302    *  4/1991

* cited by examiner

Primary Examiner—Michael B Shingleton
(74) Attorney, Agent, or Firm—Wood, Phillips, Katz, Clark & Mortimer

(57) ABSTRACT

A transimpedance amplifier for a high-speed optical fiber communication receiver includes an operational amplifier having a current input and developing a voltage output. A variable peaking capacitor is connected across the operational amplifier. A control circuit is operatively coupled to the variable capacitor for controlling capacitance to widen bandwidth of the transimpedance amplifier.

8 Claims, 3 Drawing Sheets

ADJUSTABLE PEAKING CAPACITOR IN HIGH-SPEED OPTICAL FIBER COMMUNICATION RECEIVER

BACKGROUND OF THE INVENTION

A high-speed optical fiber communication receiver, in one known form, receives a broadband optical signal and converts it to an electric signal. A transimpedance amplifier is used as the front stage of a typical such optical fiber communication receiver. Characteristics of the transimpedance amplifier can affect the overall system performance.

Referring to FIG. 1, a schematic diagram illustrates a conventional transimpedance amplifier 10 for use in an optical fiber communication receiver. The transimpedance amplifier 10 is operable to convert an input current to an output voltage. The transimpedance amplifier 10 includes a high-speed operational amplifier U having plus (+) and minus (−) inputs and differential outputs labeled Vo− and Vo+. A photo detector PD is connected between a bias voltage source Vb and the minus (−) input of the operational amplifier U. The plus (+) input of the operational amplifier U is connected to ground. The negative output Vo− comprises a voltage output to a post processing amplifier, which comprises a common voltage amplifier. A feedback resistor Rf is connected between the minus output Vo− and the minus (−) input. A peaking capacitor Cp is connected across the operational amplifier U between the plus output Vo+ and the minus (−) input.

Without the peaking capacitor Cp, the bandwidth of the transimpedance amplifier circuit 10 is defined by $$BW=1/(2*\pi*Rf*Cin*A)$$

where Cin is the input capacitance including the amplifier input capacitance and parasitic capacitance of the photo detector PD. A is the open loop gain of the operational amplifier U. π is the constant 3.1416. The peaking capacitor Cp can balance the input capacitance to widen the bandwidth without sacrifice of the transimpedance gain. For proper operation, it is important to achieve high bandwidth, high gain and low noise.

Since the peaking capacitor Cp forms a positive feedback loop, it has an optimal capacitance value which strongly depends on Cin. If the real peaking capacitance is less than the optimal value, then the transimpedance amplifier 10 can't reach the expected performance level. If the peaking capacitance is more than the optimal value, then stability of the transimpedance amplifier 10 degrades and overshoot or oscillation may occur.

In a typical application, the operational amplifier U, feedback resistor Rf and peaking capacitor Cp are integrated in a dye with the rest of the system, while the photo detector PD is a separate dye, with both dyes being placed in a single package. The parasitic capacitance of the photo detector PD is difficult to control. Photo detector manufacturers specify the maximum parasitic capacitance and the actual parasitic capacitance varies over quite a large range. In this manner, the peaking capacitor Cp has a fixed value while Cin varies. The system yield rate of optical fiber communication receivers using the transimpedance amplifier 10 shown in FIG. 1 is not stable.

The present invention is directed to overcoming one or more of the problems discussed above, in a novel and simple manner.

SUMMARY OF THE INVENTION

In accordance with the invention, there is provided an optical receiver including a transimpedance amplifier and an adjustable peaking capacitor coupled to the amplifier.

Broadly, there is disclosed herein a transimpedance amplifier comprising an operational amplifier having a current input and developing a voltage output. A variable peaking capacitor is connected across the operational amplifier. A control circuit is operatively coupled to the variable capacitor for controlling capacitance to widen bandwidth of the transimpedance amplifier and reach the optimal peaking capacitance at a real operation environment.

It is a feature of the invention that the operational amplifier has differential outputs and the variable peaking capacitor is connected to the operational amplifier to provide positive feedback.

It is another feature of the invention that the control circuit comprises an interface circuit for receiving an external command representing a desired value of the variable peaking capacitor.

It is a further feature of the invention that the interface circuit receives a data signal representing a desired value of the variable peaking capacitor and further comprising a digital to analog converter connected between the interface circuit and the variable capacitor.

It is still another feature of the invention to provide a measurement circuit selectively connected to the voltage output and the interface circuit for measuring voltage output for determining the desired value of the variable peaking capacitor. In one embodiment, the measurement circuit measures signal amplitude. In another embodiment, the measurement circuit measures pulse rise time. In a still further embodiment, the measurement circuit measures overshoot.

It is still another feature of the invention to provide a photo detector connected to the operational amplifier to provide the current controlled input.

It is another feature of the invention that the variable capacitor comprises a varactor, such as a varactor diode or any voltage control capacitors which can be integrated in an integrated circuit.

There is disclosed in accordance with another aspect of the invention, a high-speed optical receiver including a transimpedance front stage amplifier and a post amplifier. The front stage amplifier includes a photo detector connected to a current controlled input of an operational amplifier developing a voltage output. A variable peaking capacitor is connected across the operational amplifier. A control circuit is operatively coupled to the variable peaking capacitor for controlling capacitance to widen bandwidth of the transimpedance amplifier and reach the optimal peaking capacitance at a real operation environment. The post amplifier is connected to the voltage output.

Further features and advantages of the invention will be readily apparent from the specification and from the drawings.

DETAILED DESCRIPTION OF THE INVENTION

In accordance with the invention, a transimpedance amplifier uses a variable peaking capacitor instead of a fixed peaking capacitor. The variable peaking capacitor may comprise a varactor diode with capacitance depending on reverse bias across the anode and cathode. The higher the bias, the smaller the capacitance. An on-chip measurement circuit is used in the transimpedance amplifier. During a system initialization procedure, an optimization procedure for peaking capacitance is implemented to determine the optimal peaking capacitance value.

Figure 1:
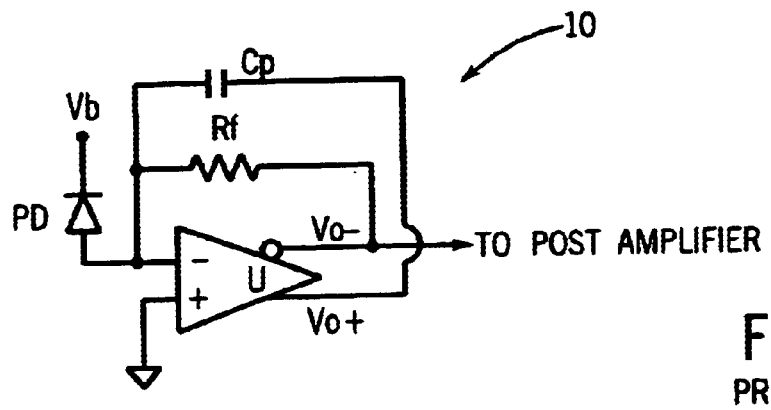
FIG. 1 is an electrical schematic of a prior art transimpedance amplifier.
Figure 2:
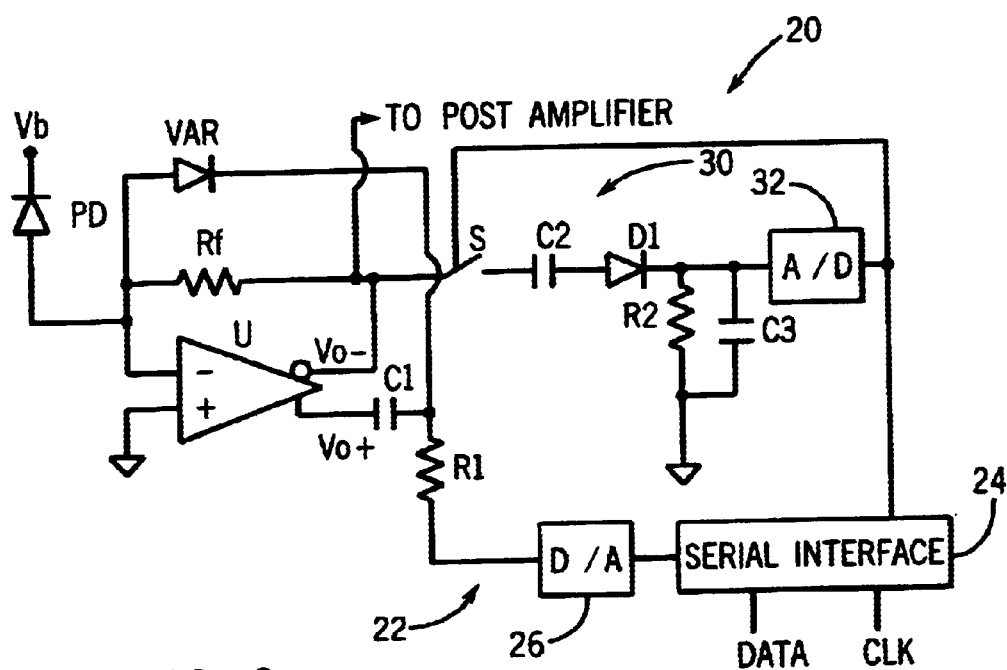
FIG. 2 is an electrical schematic of a transimpedance amplifier in accordance with a first embodiment of the invention used in an optical fiber communication receiver.

Referring to FIG. 2, a schematic illustrates a transimpedance amplifier 20 in accordance with a first embodiment of the invention. The transimpedance amplifier 20 utilizes an operational amplifier U, and a feedback resistor Rf, similar to that with the circuit of FIG. 1. The transimpedance amplifier 20 differs in replacing a fixed peaking capacitor with a variable peaking capacitor in the form of a varactor diode VAR. The variable peaking capacitor could be a voltage controlled capacitor which can be integrated in an integrated circuit. The size of the varactor VAR is selected so that the midpoint of capacitance over the bias voltage is the optimal peaking capacitance obtained from simulation or calculation. Additionally, a capacitor C1 is connected between the plus output Vo+ and the varactor VAR. A control circuit 22 is operatively coupled to the varactor VAR for controlling peaking capacitance to widen bandwidth of the transimpedance amplifier 20 and reach the optimal peaking capacitance at a real operation environment. The coupling capacitor C1 couples the AC signal from the operational amplifier U to the varactor VAR and blocks the DC voltage from the output so that the varactor bias voltage is completely controlled by the control circuit 22. Since the capacitor C1 and the varactor VAR are in series, the capacitance of C1 should be selected at least ten times larger than the maximum capacitance of the varactor so that the total capacitance strongly depends on the varactor.

The control circuit 22 includes a serial interface 24 for connection to an external controller via a data line and clock line, labeled "data" and "clk" respectively. The serial interface 24 is connected via a digital to analog (D/A) converter 26 and through an isolating resistor R1 to the varactor VAR. The isolating resistor R1 provides a DC path for the control voltage from the output of the digital to analog converter 26, but isolates the AC signal from the low ground impedance terminal of the digital to analog converter 26. The resistance of the isolating resistor R1 is to be selected ten times larger than reactance of the isolating capacitor C1 at the minimum operating frequency.

The control circuit 22 also includes a measurement circuit 30 which measures the AC signal amplitude from the transimpedance amplifier minus output Vo−. The measurement circuit 30 is connected to the operational amplifier U via a switch S. The switch S is controlled by the serial interface 24. The measurement circuit 30 comprises a rectifier including a capacitor C2, diode D1, resistor R2 and capacitor C3 connected to an analog to digital A/C converter 32. The diode D1, resistor R2 and the capacitor C3 form a typical AC rectifier. The analog to digital converter 32 is connected to the serial interface 24.

The switch S is on during a test procedure so that the on-chip measurement circuit 30 can measure the AC signal intensity on the transimpedance amplifier output Vo−. During normal operation the switch S is off to reduce the load of the transimpedance amplifier. The analog to digital converter 32 converts the measurement results to a digital signal which is supplied via the serial interface 24 to an external controller. The serial interface 24 comprises a conventional digital serial interface used to control the switch S and operations of the analog to digital converter 32 and the digital to analog converter 26.

Figure 3:
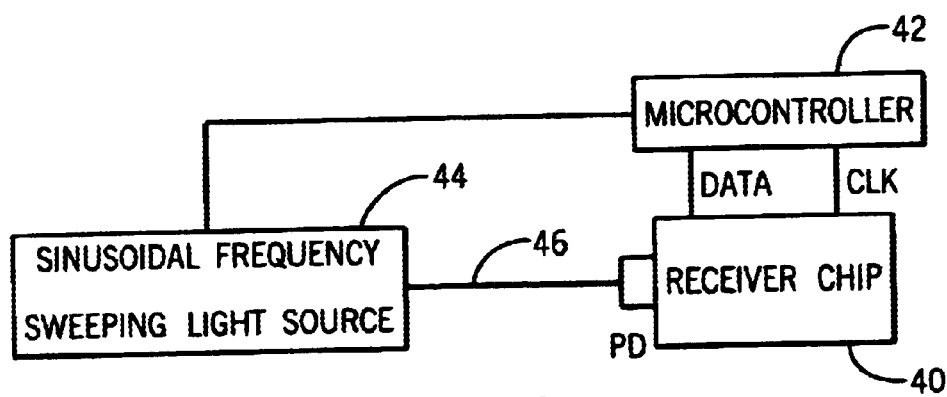
FIG. 3 is a block diagram of a system for optimizing peaking capacitance for a receiver including the transimpedance amplifier of FIG. 2.

Through manufacturing, the transimpedance amplifier 20 is packaged on a receiver chip, such as the chip 40 shown in FIG. 3. Particularly, the receiver chip 40 includes the transimpedance amplifier 20 of FIG. 2, the photo detector PD and post amplifier and other circuits unrelated to the invention. The receiver chip 40 is connected to a programmed microcontroller 42 which is in turn connected to a light source 44. The light source 44 comprises a sinusoidal frequency sweeping light source that generates an optical sinusoidal signal with an amplitude and frequency controlled by signals from the microcontroller 42. An output of the light source 44 is optically connected to the photo detector PD through an optical fiber patch cord 46. The microcontroller 42 communicates with the receiver chip 40 via the data ("data") line and clock ("clk") line.

For the optimization procedure, the microcontroller 42 sends an instruction to the receiver chip 40 to turn on the switch S, see FIG. 2. The microcontroller 42 then sends an instruction to set the output of the digital to analog converter 26 to "maximum" so that the varactor VAR has minimum capacitance. The light source 44 sweeps the optical signal with a proper optical intensity so that the rectifier output voltage is at low frequency that can fit the input range of the analog to digital converter 32. The frequency performance data is returned to the microcontroller 42 to determine bandwidth of the photo detector PD and the transimpedance amplifier 20.

If the bandwidth is not wide enough, then the microcontroller 42 decreases the output voltage of the digital to analog converter 26 to increase the peaking capacitance and the bandwidth is again measured. These steps are repeated until the bandwidth reaches the required value. The corresponding digital to analog code is recorded and sent to the user with the receiver chip 40. The user can then use this optimal value when installing the receiver chip 40 in an optical device. If the optimal peaking capacitance is temperature-dependent, then a lookup table of the digital to analog codes and temperature may be provided.

A second approach for optimal peaking capacitance provides each receiver frequency performance measurement on-line during system initialization to obtain the optimal peaking capacitance. Since a sinusoidal frequency sweeping light source is expensive, it may not be feasible to use for each receiver chip. As an alternative approach, a simple and lower cost high-speed switching optical source such as fast LED or small power laser may be used instead. Frequency performance is then based on pulse rise time measurement. However, it is difficult to measure the very short time interval directly. The alternative embodiment described below gives a time-voltage transfer method so that a short time interval measurement is converted to a voltage measurement.

Figure 4:
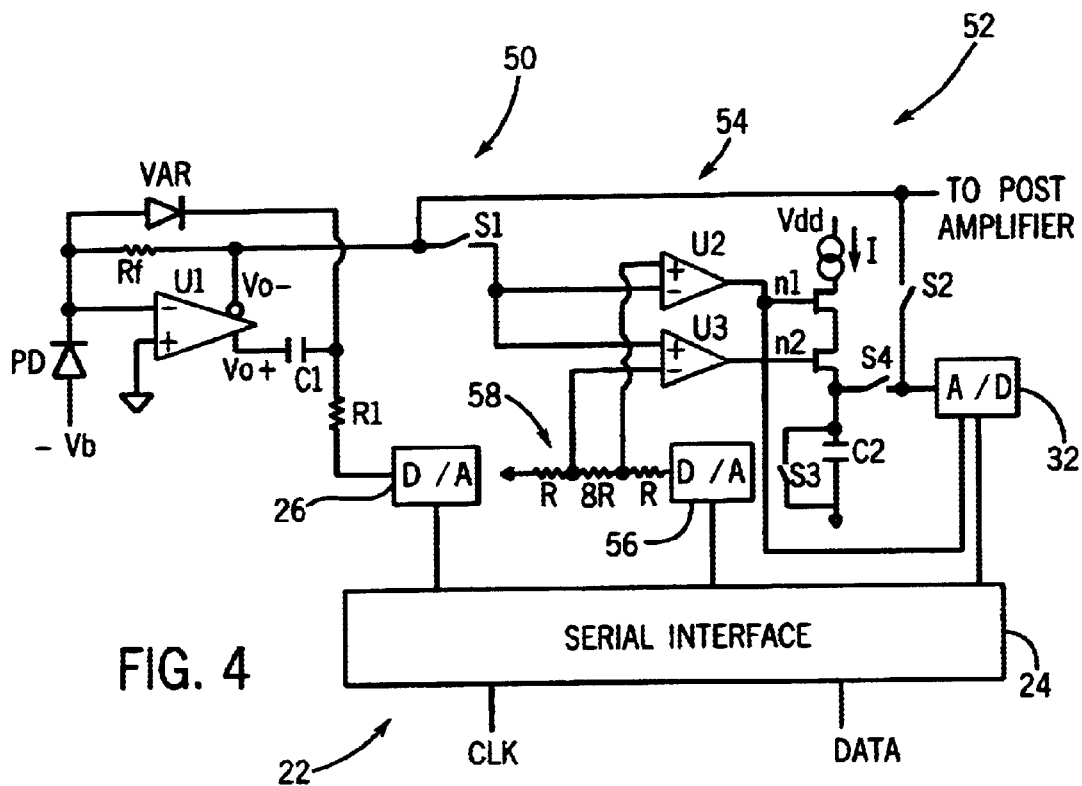
FIG. 4 is an electrical schematic of a transimpedance amplifier in accordance with a second embodiment of the invention used in an optical fiber communication receiver.

Referring to FIG. 4, a transimpedance amplifier 50 in accordance with a second embodiment of the invention is illustrated. For simplicity, elements corresponding to the elements of FIG. 2 are shown with like reference numerals and are not described in detail herein. The transimpedance amplifier 50 differs from the transimpedance amplifier 20 of FIG. 2 with respect to a control circuit 52. The control circuit 52 comprises an interface circuit 54 and a measurement circuit 56. Additionally, the photo detector PD is supplied by a negative bias voltage −Vb. The photo detector PD draws current from an operational amplifier U1 when an optical signal enters so that the output signal from the operational amplifier U1 is positive.

The control circuit 52 includes four switches, S1, S2, S3 and S4 controlled by the serial interface 24. The switch S1 is connected between the operational amplifier minus output Vo− and first and second high-speed comparators U2 and U3. A second digital to analog converter 56 is connected to the serial interface 24 and provides threshold voltages for the comparators U2, U3 and a voltage divider network 58. The comparators U2 and U3 are connected to gates of series connected FETs n1 and n2. The FETs n1 and n2 are connected between a current source and a capacitor C2. The current source is connected to a supply VDD. The other terminal of the capacitor C2 is connected to ground. The third switch S3 is connected across the capacitor C2. The fourth switch S4 is connected between the source of the second FET n2 and the analog to digital converter 32. The second switch S2 is connected between the voltage output Vo− and the analog to digital converter 32.

FIG. 4 illustrates a receiver chip 60 including the transimpedance amplifier 50 of FIG. 4 connected to a system computer 62 for determining optical peaking capacitance for the second embodiment. The system computer 62 is connected via a pulsed light source 64 to an optical fiber coupler 66. The optical fiber coupler 66 is inserted between the fiber from a transmitter and the receiver input. The coupler has a ratio of 99 to 1 and introduces about 0.04 dB insertion loss for the input optical signal, which can usually be ignored.

The pulsed light source 64 is triggered by the system computer 62. The optical pulse amplitude is set to generate the transimpedance output amplitude which can be measured by the analog to digital converter 32, see FIG. 4. The rise time of the optical pulse should be shorter than the real communication optical signal and the pulse width should be long enough so that the analog to digital converter 32 can measure the stable amplitude on the transimpedance amplifier output Vo−.

During system initialization, the following steps are implemented to optimize the peaking capacitance. The system computer 62 sets the first digital to analog converter 26 to the maximum output voltage so that the varactor VAR has the minimum capacitance. The second switch S2 is turned on. The pulsed light source 64 is triggered to send out an optical pulse to the receiver 60. The analog to digital converter 32 is triggered to measure the amplitude voltage of the transimpedance amplifier output Vo−. The output of the second digital to analog converter 56 is set so the output voltage is the same as the amplitude voltage just measured by the analog to digital converter 32. The second switch S2 is turned off and the first switch S1 is turned on. The third switch S3 is turned on to fully discharge the second capacitor C2. Then the third switch S3 is turned off. The pulsed light source 64 is triggered to send out an optical pulse to the receiver 60.

The voltage divider network formed by resistors R, 8R and R divides the amplitude voltage to 10% and 90%. The 10% peak voltage is set as the threshold of the third comparator U3 while the 90% peak voltage is set as the threshold of the second comparator U2. The pulse signal under test is connected to the negative input of the second comparator U2 and positive input of the third comparator U3. When the pulse voltage is between 10% threshold and 90% threshold, both comparators U2 and U3 have logical high outputs and both FETs n1 and n2 are turned on, the current source I charges the capacitor C2, and the voltage on the capacitor C2 increases. When the pulse voltage reaches the 90% threshold, the output of the second comparator U2 changes from logical high to logical low, the first FET n1 is turned off, and the capacitor C2 charge is stopped. Meanwhile, the charge in the output of the second comparator U2 triggers the analog to digital converter 32 which samples the voltage on the capacitor C2. Since the current source I charged the capacitor C2 with a constant current, the voltage on the capacitor C2 is proportional to the time period when the pulse voltage changed from 10% amplitude to 90% amplitude, that is the pulse rise time. Therefore the voltage on the capacitor C2 represents the pulse rise time.

The rise time of the pulse is read from the analog to digital converter 32. The varactor bias voltage is reduced through the first digital to analog converter 26 until a required rise time is obtained.

Figure 6:
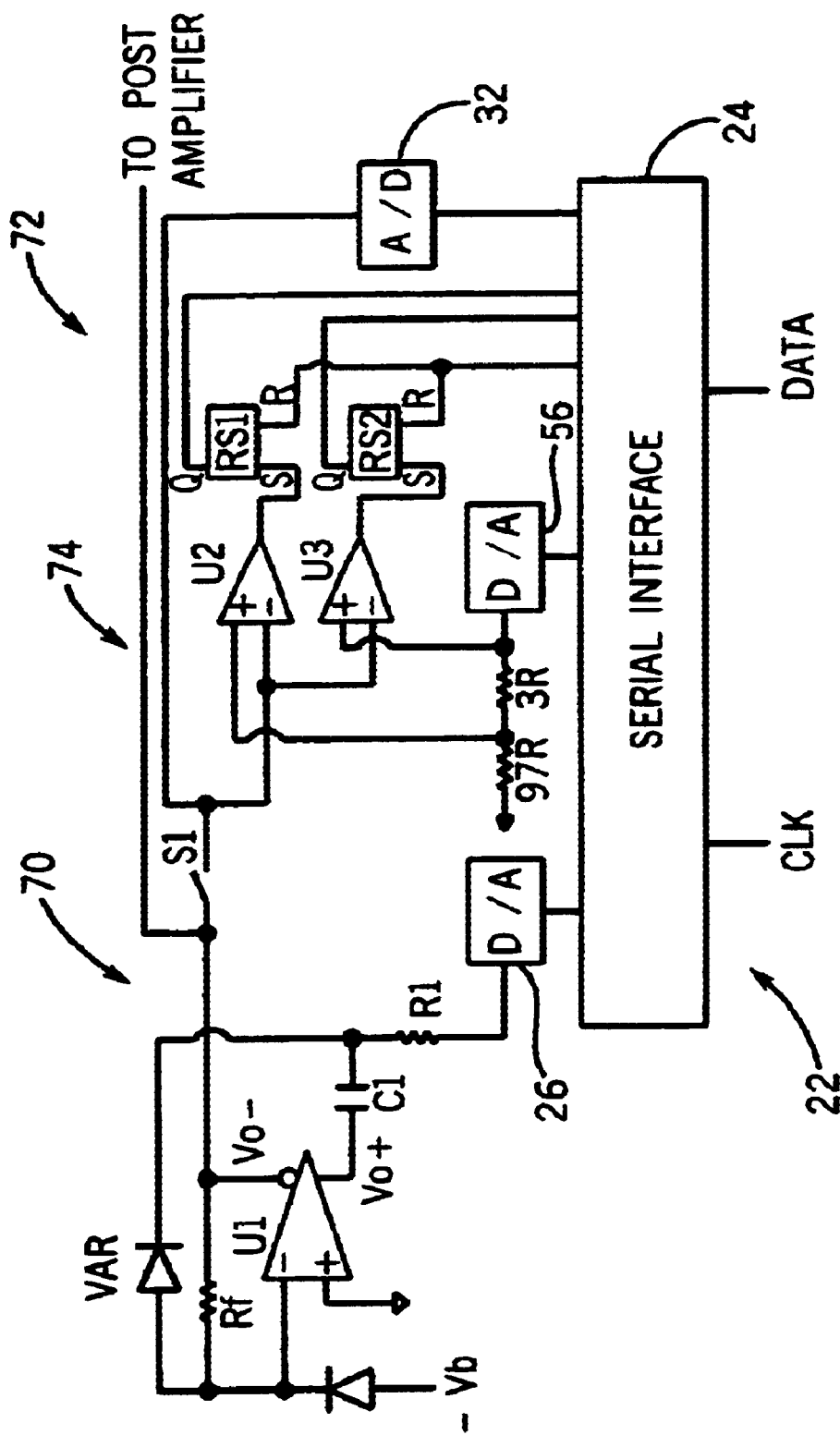
FIG. 6 is an electrical schematic of a transimpedance amplifier in accordance with a third embodiment of the invention used in an optical fiber communication receiver.

Referring to FIG. 6, a transimpedance amplifier 70 according to a third embodiment is illustrated. In this embodiment, the optical peaking capacitance value is determined by measuring overshoot. Particularly, based on this approach a low percentage overshoot is acceptable for a stable system such as 5 percent. The overshoot is measured for each increment of the peaking capacitance until the overshoot is within a preset range for example, between two percent to five percent. Here again, elements which correspond to the elements of the embodiments of FIGS. 2 and 4 are illustrated with like reference numerals. A control circuit 72 includes a measurement circuit 74 using flipflops RS1 and RS2 receiving the outputs of the respective comparators U2 and U3. The outputs of the flipflops RS1 and RS2 are connected to the serial interface 24. The analog to digital converter 32 samples the pulse amplitude and the second digital to analog converter 56 outputs the voltage of 1.05 times the amplitude as the threshold of the voltage comparator U3. A voltage divider of resistors 3R and 97R provide the voltage comparator U2 with a threshold of 1.02 times the amplitude. When the transimpedance amplifier output voltage V0− exceeds the thresholds of the comparators U2 and U3, a voltage transition from high to low occurs at the comparator output to trigger the associated flipflop RS1 or RS2. The flipflops RS1 and RS2 can be reset by the serial interface 24.

Figure 5:
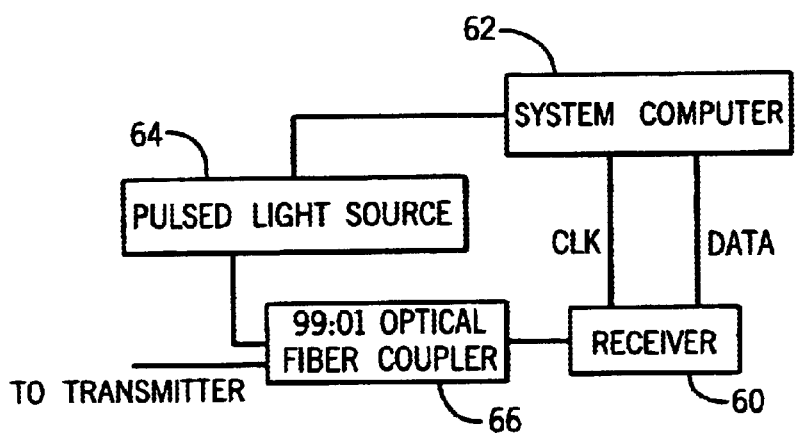
FIG. 5 is a block diagram of a system for optimizing peaking capacitance for a receiver including the transimpedance amplifier of FIG. 4.

The system shown in FIG. 5 is used for an optimization procedure for a receiver including the transimpedance amplifier 70 of FIG. 6. The optimization procedure is as follows. The system computer 62 sets the first digital to analog converter 26 to provide maximum output voltage so that the varactor VAR has the minimum capacitance. The first switch S1 is turned on. The pulsed light source 64 is triggered to send out an optical pulse. The analog to digital converter 32 is triggered to measure the amplitude voltage of the transimpedance amplifier output. The output voltage of the second digital to analog converter 56 is set to 1.05 times the amplitude voltage measured by the analog to digital converter 32. The flipflops RS1 and RS2 are reset. The pulsed light source 64 is triggered to send out an optical pulse to the receiver. The logical status of the outputs of the flipflops RS1 and RS2 are checked. If both outputs are logical high, then the varactor bias voltage is reduced through the first digital to analog converter 26. These steps are repeated until the output of the second flipflop RS2 is at a logical status low and the output of the first flipflop RS1 is at a logical status high.

Thus, in accordance with the invention, there is provided a high-speed optical fiber communication receiver including a transimpedance amplifier with an adjustable peaking capacitor.

I claim:

1. A transimpedance amplifier comprising:

an operational amplifier having a current controlled input and developing a voltage output;

a variable peaking capacitor connected across the operational amplifier; and a control circuit operatively coupled to the variable peaking capacitor for controlling capacitance to widen bandwidth of the transimpedance amplifier and reach the optimal peaking capacitance at a real operation environment the control circuit including an interface circuit and a measurement circuit, the interface circuit capable of receiving an external command representing a desired value of the variable peaking capacitor, the measurement circuit selectively connected to the voltage output and the interface circuit for measuring signal amplitude from the voltage output for determining the desired value of the variable peaking capacitor.

2. A transimpedance amplifier comprising:

an operational amplifier having a current controlled input and developing a voltage output;

a variable peaking capacitor connected across the operational amplifier; and a control circuit operatively coupled to the variable peaking capacitor for controlling capacitance to widen bandwidth of the transimpedance amplifier and reach the optimal peaking capacitance at a real operation environment, the control circuit including an interface circuit and a measurement circuit, the interface circuit capable of receiving an external command representing a desired value of the variable peaking capacitor, the measurement circuit selectively connected to the voltage output and the interface circuit for measuring pulse rise time from the voltage output for determining the desired value of the variable peaking capacitor.

3. A transimpedance amplifier comprising:

an operational amplifier having a current controlled input and developing a voltage output;

a variable peaking capacitor connected across the operational amplifier; and a control circuit operatively coupled to the variable peaking capacitor for controlling capacitance to widen bandwidth of the transimpedance amplifier and reach the optimal peaking capacitance at a real operation environment, the control circuit including an interface circuit and a measurement circuit the interface circuit capable of receiving an external command representing a desired value of the variable peaking capacitor, the measurement circuit selectively connected to the voltage output and the interface circuit for measuring overshoot from the voltage output for determining the desired value of the variable peaking capacitor.

4. A high speed optical receiver comprising:

transimpedance front stage amplifier including a photo detector connected to a current controlled input of an operational amplifier developing a voltage output, a variable peaking capacitor connected across the operational amplifier, and a control circuit operatively coupled to the variable peaking capacitor for controlling capacitance to widen bandwidth of the transimpedance amplifier, the control circuit including an interface circuit for receiving an external command representing a desired value of the variable peaking capacitor;

a measurement circuit selectively connected to the voltage output and the interface circuit for measuring the voltage output for determining the desired value of the variable peaking capacitor; and a post amplifier connected to the voltage output.

5. A high speed optical receiver comprising:

transimpedance front stage amplifier including a photo detector connected to a current controlled input of an operational amplifier developing a voltage output a variable peaking capacitor connected across the operational amplifier, and a control circuit operatively coupled to the variable peaking capacitor for controlling capacitance to widen bandwidth of the transimpedance amplifier, the control circuit including an interface circuit for receiving an external command representing a desired value of the variable peaking capacitor;

a measurement circuit selectively connected to the voltage output and the interface circuit for measuring signal amplitude from the voltage output for determining the desired value of the variable peaking capacitor; and a post amplifier connected to the voltage output.

6. A high speed optical receiver comprising:

transimpedance front stage amplifier including a photo detector connected to a current controlled input of an operational amplifier developing a voltage output, a variable peaking capacitor connected across the operational amplifier, and a control circuit operatively coupled to the variable peaking capacitor for controlling capacitance to widen bandwidth of the transimpedance amplifier, the control circuit including an interface circuit for receiving an external command representing a desired value of the variable peaking capacitor;

a measurement circuit selectively connected to the voltage output and the interface circuit for measuring pulse rise time from the voltage output for determining the desired value of the variable peaking capacitor; and a post amplifier connected to the voltage output.

7. A high speed optical receiver comprising:

transimpedance front stage amplifier including a photo detector connected to a current controlled input of an operational amplifier developing a voltage output, a variable peaking capacitor connected across the operational amplifier, and a control circuit operatively coupled to the variable peaking capacitor for controlling capacitance to widen bandwidth of the transimpedance amplifier, the control circuit including an interface circuit for receiving an external command representing a desired value of the variable peaking capacitor;

a measurement circuit selectively connected to the voltage output and the interface circuit for measuring overshoot from the voltage output for determining the desired value of the variable peaking capacitor; and a post amplifier connected to the voltage output.

8. The high speed optical receiver of claim 4 wherein the measurement circuit further comprises a switch connected to the voltage output, the measurement circuit selectively turning the switch on the measure the voltage output during a test procedure and turning the switch off during normal operation to reduce load of the transimpedance amplifier.

* * * * *